(12) United States Patent
Choi et al.

(10) Patent No.: US 6,927,535 B2
(45) Date of Patent: Aug. 9, 2005

(54) ORGANIC ELECTROLUMINESCENT DEVICE INCLUDING TRANSPARENT CONDUCTIVE LAYER AND FABRICATING METHOD THEREOF

(75) Inventors: Nack-Bong Choi, Suwon (KR); Kwang-Yeon Lee, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 17 days.

(21) Appl. No.: 10/330,298

(22) Filed: Dec. 30, 2002

(65) Prior Publication Data

US 2003/0173894 A1 Sep. 18, 2003

(30) Foreign Application Priority Data

Mar. 15, 2002 (KR) ................... 10-2002-0014170

(51) Int. Cl.⁷ ................................ H05B 33/00
(52) U.S. Cl. ........................ 313/504; 313/506
(58) Field of Search ................. 313/504, 506; 428/690

(56) References Cited

U.S. PATENT DOCUMENTS

| | | | |
|---|---|---|---|
| 5,643,685 A | | 7/1997 | Torikoshi |
| 5,837,391 A | * | 11/1998 | Utsugi .................. 428/690 |
| 6,013,983 A | | 1/2000 | Asano et al. |
| 6,086,790 A | | 7/2000 | Hayashi et al. |
| 6,224,966 B1 | * | 5/2001 | Sakai et al. ............. 428/212 |
| 6,259,202 B1 | | 7/2001 | Sturm et al. |
| 6,264,805 B1 | | 7/2001 | Forrest et al. |
| 6,280,860 B1 | | 8/2001 | Ueda et al. |
| 6,280,861 B1 | | 8/2001 | Hosokawa et al. |
| 6,303,255 B1 | | 10/2001 | Sakaguchi et al. |
| 6,307,317 B1 | | 10/2001 | Codama et al. |
| 6,312,837 B1 | | 11/2001 | Kijima |
| 6,326,091 B1 | | 12/2001 | Schoo et al. |
| 6,327,554 B1 | | 12/2001 | Kobori |
| 6,420,834 B2 | * | 7/2002 | Yamazaki et al. ....... 315/169.3 |
| 6,509,109 B1 | * | 1/2003 | Nakamura et al. ........ 428/690 |

* cited by examiner

Primary Examiner—Joseph Williams
(74) Attorney, Agent, or Firm—Morgan, Lewis, Bockius LLP

(57) ABSTRACT

A method of fabricating an electrode for an organic electroluminescent device includes forming a transparent conductive layer on a substrate, doping the transparent conductive layer with impurities, and annealing the doped transparent conductive layer.

11 Claims, 3 Drawing Sheets

Doping with impurities

Annealing

ORGANIC ELECTROLUMINESCENT DEVICE INCLUDING TRANSPARENT CONDUCTIVE LAYER AND FABRICATING METHOD THEREOF

The present invention claims the benefit of the Korean Patent Application No. P2002-14170 filed in Korea on Mar. 15, 2002, which is hereby incorporated by reference.

BACKGROUND OF THE INVENTION

1. Field of the Invention

The present invention relates to an organic electroluminescent device, and more particularly, to an organic electroluminescent device including a transparent conductive layer and a fabricating method thereof.

2. Discussion of the Related Art

In general, liquid crystal display (LCD) devices are commonly used for flat panel displays (FPDs) because they are lightweight and consume relatively low amounts of power. However, LCD devices are not light-emitting displays. As such, LCDs have several disadvantages including dim displays, poor contrast ratios, narrow viewing angles and small display sizes. Accordingly, new FPDs, such as organic electroluminescent (EL) devices, have been developed to solve these problems. Organic EL devices are light-emitting displays that possess a wider viewing angle and a better contrast ratio than LCD devices. Furthermore, since no backlight is required for an organic EL device, organic EL devices generally are both lighter and thinner than LCD devices, and consume less power. Organic EL devices may be driven with a low direct current (DC) voltage that permits a faster response speed than LCD devices. Moreover, since organic EL devices are solid-phase devices, unlike LCD devices, they can better withstand external impacts and possess a greater operational temperature range. In addition, organic EL devices may be manufactured more cheaply than LCD devices or plasma display devices (PDPs) because organic EL devices require only deposition and encapsulation apparatus.

A passive matrix design that does not use additional thin film transistors (TFTs) may be used for organic EL devices. However, passive matrix organic EL devices have limited display resolution, relatively high power consumption, and a relatively short expected life span. Thus, active matrix organic EL devices have been developed as next-generation display devices that provide high resolution over a large display area. In passive matrix organic EL devices, a scan line and a signal line cross each other to provide a switching element for a sub-pixel. In contrast, a TFT, disposed at each sub-pixel, is used as a switching element in active matrix organic EL devices. The TFT is used to turn each sub-pixel ON or OFF. Specifically, a first electrode, which is connected to the TFT, is turned ON or OFF by the sub-pixel, and a second electrode, which faces the first electrode, functions as a common electrode.

FIG. 1 is an energy band diagram of an organic electroluminescent device according to the related art. In FIG. 1, the organic electroluminescent device includes an anode 1 and a cathode 7 that are separated from each other, a hole injection layer 2, a hole transporting layer 3, an emission layer 4, an electron transporting layer 5, and an electron injection layer 6 interposed between the anode 1 and the cathode 7. The hole injection layer 2 and the electron injection layer 6 contact the anode 1 and the cathode 7, respectively. A hole that is on the anode 1 passes through the hole injection layer 2 and the hole transporting layer 3 and is injected into the emission layer 4. An electron that is on the cathode 7 passes through the electron injection layer 6 and the electron transporting layer 5 and is injected into the emission layer 4. The hole and the electron injected into the emission layer 4 form an exciton 8, and light is emitted by the formation of the exciton 8. Since mobility of the hole and mobility of the electron are substantially different in an organic material, the hole and the electron are effectively transported to the emission layer by using the hole transporting layer and the electron transporting layer. Thus, the multi-layer organic electroluminescent device has a high emission efficiency due to a balance of densities of holes and electrons in the emission layer.

The anode 1 may be made of a transparent conductive material such as indium-tin-oxide (ITO) and indium-zinc-oxide (IZO). The cathode 7 may be made of a chemically stable material whose work function is lower than that of the anode 1. As the work function of the cathode is lowered, a lower driving voltage is required. Moreover, a lower work function results in improved brightness and current density. The cathode may be made of aluminum (Al), calcium (Ca), lithium:aluminum (Li:Al), or magnesium:silver (Mg:Ag).

In FIG. 1, since an anode 1 made of ITO has a work function between about 4.7 eV and about 4.8 eV, and the hole injection layer 2 has a work function between about 5.2 eV and about 5.3 eV, an energy band gap "I" exists between the anode 1 and the hole injection layer 2. Accordingly, the injection efficiency of a hole from the anode 1 is reduced due to the work function difference between the anode 1 and the hole injection layer 2. Since an organic electroluminescent device uses carrier injection, the device performance is reduced by the loss of injection efficiency of the carrier. Moreover, adhesion between the anode and the organic thin film is basically poor in the organic electroluminescent device. As a result, the anode and the organic thin film may separate due to differences in their interface voltages and thermal expansion coefficients at high driving voltages or high temperatures. Accordingly, degradation of the organic electroluminescent device may occur, which may result in a reduction in the expected life span of the organic electroluminescent device.

SUMMARY OF THE INVENTION

Accordingly, the present invention is directed to an organic electroluminescent device and a fabricating method thereof that substantially obviate one or more of the problems due to limitations and disadvantages of the related art.

An object of the present invention is to provide an organic electroluminescent device with improved injection efficiency, expected life span and display quality, and a fabricating method thereof.

Another object of the present invention is to provide an organic electroluminescent device and a fabricating method thereof where an anode of a transparent conductive layer is doped with impurities and annealed.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating an electrode for an organic electroluminescent device includes steps of forming a transparent conductive layer on a substrate, doping the transparent conductive layer with impurities, and annealing the doped transparent conductive layer.

In another aspect, a method of fabricating an organic electroluminescent device includes forming a transparent conductive layer on a substrate, doping the transparent conductive layer with impurities, annealing the doped transparent conductive layer, forming a plurality of organic electroluminescent layers, to include a first organic electroluminescent layer and a second electroluminescent layer such that the first organic electroluminescent layer is coupled to the first electrode, and forming a second electrode coupled to the second organic electroluminescent layer.

In another aspect, an organic electroluminescent device includes a substrate, a first electrode on the substrate, a plurality of organic electroluminescent layers, the plurality of organic electroluminescent layers include a first organic electroluminescent layer and a second organic electroluminescent layer, and the first organic electroluminescent layer is coupled to the first electrode, and a second electrode coupled to the second organic electroluminescent layer.

In another aspect, an electrode of an organic electroluminescent device is produced by a process comprising forming a transparent conductive layer on a substrate, doping the transparent conductive layer with impurities, and annealing the doped transparent conductive layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 2A:
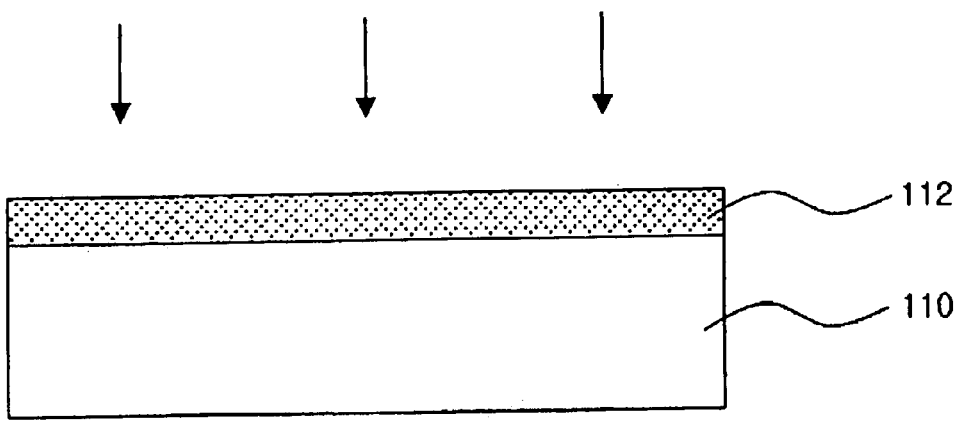
FIGS. 2A and 2B are schematic cross-sectional views showing an exemplary process for fabricating a transparent conductive layer for an organic electroluminescent device according to the present invention.
Figure 2B:
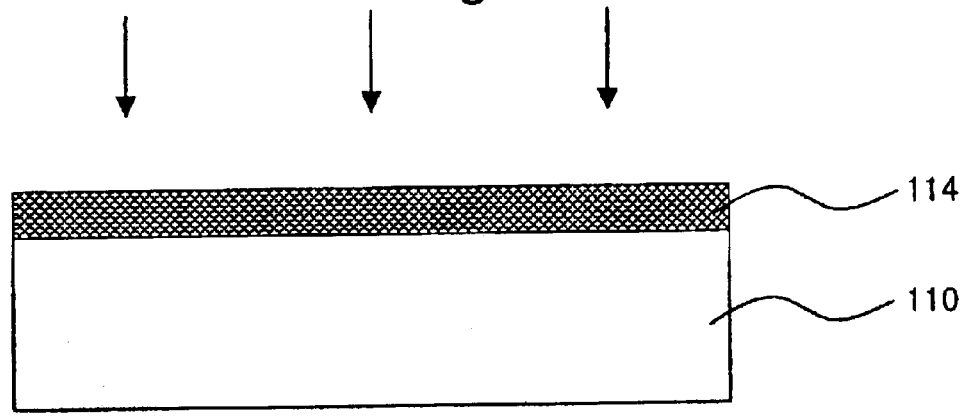

FIGS. 2A and 2B are schematic cross-sectional views showing an exemplary process for fabricating a transparent conductive layer for an organic electroluminescent device according to the present invention. In FIG. 2A, after a transparent conductive layer 112 is formed on a substrate 110, the transparent conductive layer 112 may be doped with impurities. The substrate 110 may be a transparent substrate or an array substrate depending on the method of driving the organic electroluminescent device. The transparent conductive layer 112 may include indium-tin-oxide (ITO) or indium-zinc-oxide (IZO), for example. The impurities may be positive type (p-type) compounds containing boron (B) such as $B_2H_6$ or $H_2$ ($B_2H_6:H_2=20\%:80\%$), between about $5\times10^{14}$ ions/cm$^2$ and about $3\times10^{15}$ ions/cm$^2$, and may be accelerated with an acceleration voltage of about 30 KV. Alternatively, the impurities may be made of negative type (n-type) compounds containing phosphorus (P), such as $PH_3$. The transparent conductive layer 112 may be about 1400 Å thick, and a maximum concentration depth ($R_p$) of the doped impurities may be about 40 Å from a top surface of the transparent conductive layer 112. Preferably, the maximum concentration depth may be about 30% of the thickness of the transparent conductive layer 112. When the transparent conductive layer 112 is doped with impurities, its work function may be increased by between about 0.04 eV and about 0.14 eV. Accordingly, the transparent conductive layer (first electrode) has a work function greater than about 4.84 eV. The resulting increase of the work function may be measured by using a cyclic voltamogram (CV), for example. The transparent conductive layer 112 may function as a first electrode of the organic electroluminescent device. A hole injection layer (not shown) made from an organic material may subsequently be formed on the first electrode by a separate process. The increase in the work function of the transparent conductive layer 112 caused by doping the transparent conductive layer 112 with impurities may reduce the difference in work functions between the first electrode and the hole injection layer. As a result, an injection efficiency of a carrier, such as a hole, may be improved.

In FIG. 2B, after the transparent conductive layer 114 is doped with the impurities, the transparent conductive layer 114 may be annealed. The process of annealing the doped transparent conductive layer 114 may reduce surface roughness and increase transmittance. The annealing process may be performed at a temperature between about 230° C. and about 400° C. for between about 30 minutes and about 2 hours. Preferably, the doped transparent conductive layer 114 may be annealed at a temperature of about 400° C. for about 30 minutes. Exemplary transparent conductive layers are compared in Table 1. Each sample used to produce the results presented in Table 1 had a transparent conductive layer made of ITO.

TABLE 1

|  | Doping | Doping condition (DOSE/ Acceleration Voltage) | Thickness | Annealing | Resistivity | Transmittance |
| --- | --- | --- | --- | --- | --- | --- |
| Sample 1 | X | — | 1400 Å | ○ | 207.2 Ω · cm | 94% |
| Sample 2 | X | — | 1400 Å | X | 195.7 Ω · cm | 79% |
| Sample 3 | ○ | 3 × 10$^{15}$/30 KV | 1400 Å | ○ | 211.5 Ω · cm | 95% |
| Sample 4 | ○ | 5 × 10$^{14}$/30 KV | 1400 Å | X | 495.2 Ω · cm | 80% |
| Sample 5 | ○ | 5 × 10$^{14}$/30 KV | 1400 Å | ○ | 156.5 Ω · cm | 96% |

Samples 1 and 2 were not doped with impurities, and Samples 2 and 4 were not annealed. In Table 1, the transparent conductive layer of Sample 5 has a lower resistivity than the other samples. Moreover, the transparent conductive layer of Sample 5 has an equivalent transmittance to that of Sample 1.

Figure 1:
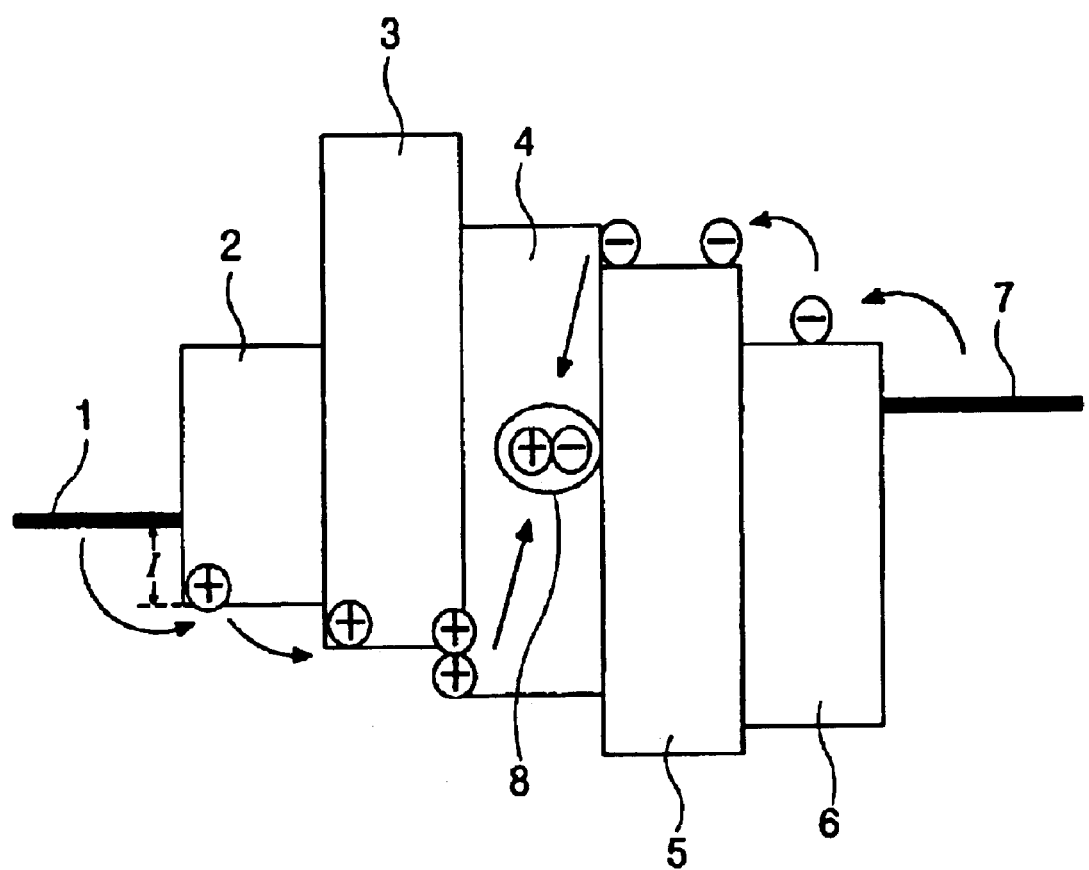
FIG. 1 is an energy band diagram of an organic electroluminescent device according to the related art.
Figure 3:
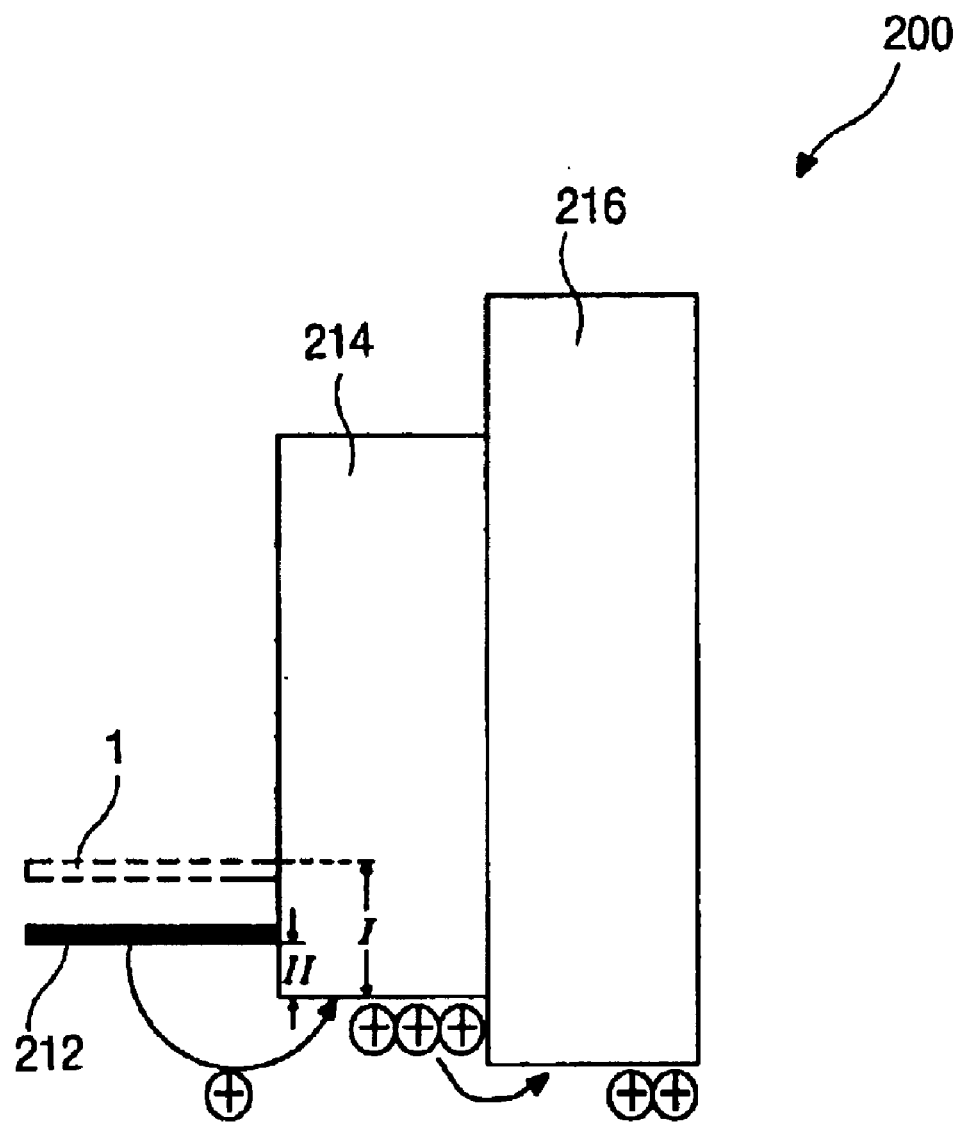
FIG. 3 is an energy band diagram of an exemplary organic electroluminescent device according to the present invention.

FIG. 3 is an energy band diagram of an exemplary organic electroluminescent device according to the present invention. An emission layer, an electron transporting layer, and an electron injection layer have been omitted in FIG. 3 for clarity. The structure of FIG. 1 can be used to incorporate the omitted structures of FIG. 3. In FIG. 3, an organic electroluminescent device 200 includes an anode 212, a hole injection layer 214, and a hole transporting layer 216. The anode 212 may include a transparent conductive layer that has been doped with impurities. Accordingly, the difference between the work function of the anode 212 and the work function of the hole injection layer 214 ("II") is less than the difference between the work function of the related art anode 1 and the work function of the hole injection layer 214 ("I"). Thus, the injection efficiency from the anode 212 to the hole injection layer 214 is greater than the injection efficiency from the related art anode 1 to the hole injection layer 214. As a result, characteristics of the organic electroluminescent device 200, such as brightness, may be improved as a result. Furthermore, the process of annealing the transparent conductive layer for the anode 212 may result in reduced surface roughness, increased transmittance, and strengthened connectivity between the anode 212 and the hole injection layer 214, thereby increasing the expected life span of the organic electroluminescent device.

The hole injection layer 214 and the hole transporting layer 216 can be made of either a high molecular substance or a low molecular substance. If a low molecular substance is used, the hole transporting layer 216 may be omitted. The organic electroluminescent device of the present invention may be either an active matrix organic electroluminescent device or a passive matrix organic electroluminescent device. Furthermore, the transparent conductive layer of the present invention may be used as a top emission electrode or a bottom emission electrode depending upon the direction in which light is to be emitted.

Therefore, by reducing the difference between the work functions at the interface of an electrode and an organic thin film, the properties of an organic electroluminescent device are improved. Moreover, by reducing the surface roughness and increasing the transmittance of the electrode by an annealing process, display quality is improved and the expected life span of the device is increased.

It will be apparent to those skilled in the art that various modifications and variations can be made in the organic electroluminescent device and the fabricating method thereof of the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:

a substrate;

a first electrode of a transparent conductive material including impurities on the substrate;

a plurality of organic electroluminescent layers, the plurality of organic electroluminescent layers includes a first organic electroluminescent layer and a second organic electroluminescent layer, and the first organic electroluminescent layer is coupled to the first electrode; and a second electrode coupled to the second organic electroluminescent layer.

2. The device according to claim 1, wherein the first organic electroluminescent layer includes a hole injection layer.

3. The device according to claim 2, wherein the first electrode includes at least one of indium-tin-oxide and indium-zinc-oxide.

4. The device according to claim 3, wherein the hole injection layer has a work function between about 5.2 eV and about 5.3 eV, and the first electrode has a work function greater than about 4.84 eV.

5. The device according to claim 3, wherein the first electrode is formed by doping a transparent conductive layer with impurities between about $5\times10^{14}$ ions/cm$^2$ and about $3\times10^{15}$ ions/cm$^2$ at an acceleration voltage of about 30 kV.

6. The device according to claim 5, wherein the impurities are positive type (p-type) impurities.

7. The device according to claim 6, wherein the impurities are compounds including boron impurities.

8. The device according to claim 5, wherein the impurities are negative type (n-type) impurities.

9. The device according to claim 8, wherein the impurities are compounds including phosphorous impurities.

10. The device according to claim 3, wherein the first electrode is formed by annealing a doped transparent conductive layer at a temperature between about 230° C. and about 400° C. for a time period between about 30 minutes to about 2 hours.

11. The device according to claim 3, wherein the first electrode is formed by annealing a doped transparent conductive layer at a temperature of about 400° C. for about 30 minutes.

* * * * *